United States Patent
Chen et al.

(10) Patent No.: US 11,139,006 B1
(45) Date of Patent: Oct. 5, 2021

(54) SELF-BIASED SENSE AMPLIFICATION CIRCUIT

(71) Applicant: eMemory Technology Inc., Hsin-Chu (TW)

(72) Inventors: Chih-Chun Chen, Hsinchu County (TW); Chun-Hung Lin, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 17/131,802

(22) Filed: Dec. 23, 2020

Related U.S. Application Data

(60) Provisional application No. 62/988,403, filed on Mar. 12, 2020.

(51) Int. Cl.
*G11C 7/08* (2006.01)

(52) U.S. Cl.
CPC .......... *G11C 7/08* (2013.01); *G11C 2207/063* (2013.01)

(58) Field of Classification Search
CPC ........................................................ G11C 7/08
USPC ........................................................ 365/208
See application file for complete search history.

(56) References Cited

U.S. PATENT DOCUMENTS

| | | | |
|---|---|---|---|
| 6,566,914 B2 | 5/2003 | Bruneau | |
| 6,707,712 B2* | 3/2004 | Lowery | G11C 11/5678 365/100 |
| 8,164,362 B2 | 4/2012 | Afghahi | |
| 8,699,275 B1* | 4/2014 | Raghavan | G11C 11/5642 365/185.21 |
| 8,830,768 B2 | 9/2014 | Kim | |
| 10,410,697 B2 | 9/2019 | Chen | |
| 2013/0308377 A1* | 11/2013 | Choi | G11C 13/004 365/163 |
| 2015/0228315 A1* | 8/2015 | Wang | G11C 5/06 365/72 |
| 2018/0315482 A1* | 11/2018 | Chen | G11C 16/26 |

FOREIGN PATENT DOCUMENTS

TW    I460729 B    11/2014

\* cited by examiner

*Primary Examiner* — Muna A Techane
(74) *Attorney, Agent, or Firm* — Winston Hsu

(57) ABSTRACT

A self-biased sense amplification circuit includes a local bit line, a reset unit, a main bit lie, a pre-amplifier, a data line, a sample reference unit, and a sense amplifier. The local bit line receives a cell current generated by a memory cell during a sense operation. The reset unit resets the local bit line to a first system voltage during a sample operation. The pre-amplifier generates a read current on the main bit line according to a voltage of the local bit line during the sample operation and the sense operation. The data line is coupled to the main bit line. The sample reference unit generates a first reference current and a second reference current during the sample operation, and generates the first reference current during the sense operation. The sense amplifier senses a voltage of the data line.

13 Claims, 3 Drawing Sheets

US 11,139,006 B1

SELF-BIASED SENSE AMPLIFICATION CIRCUIT

CROSS REFERENCE TO RELATED APPLICATIONS

This non-provisional application claims priority of U.S. provisional application No. 62/988,403, filed on Mar. 12, 2020, included herein by reference in its entirety.

BACKGROUND OF THE INVENTION

1. Field of the Invention

The present invention is related to a sense amplification circuit, and more particularly, to a self-biased sense amplification circuit.

2. Description of the Prior Art

The data stored in a memory cell is often read by sensing the cell current generated by the memory cells. For example, if the cell current is greater than a reference current, then it implies that the data stored in the memory cell has a first type of value. However, if the cell current is not greater than the reference current, then it implies that the data stored in the memory cell has a second type of value. That is, the reference current can be critical for the read operation of the memory cell.

However, it can be difficult to provide an un-biased reference current source due to the uncontrollable variance caused during the manufacturing process. Furthermore, if an inappropriate reference current is used, then the read margin would be rather small, and the small read margin can not only slow down the read process but also affect the accuracy of the read operation.

SUMMARY OF THE INVENTION

One embodiment of the present invention discloses a self-biased sense amplification circuit. The sense amplification circuit includes a local bit line, a reset unit, a main bit line, a pre-amplifier, a data line, a sample reference circuit, and a second amplifier.

The local bit line is coupled to a memory cell, and receives a cell current generated by the memory cell during a sense operation. The reset unit is coupled to the local bit line, and resets the local bit line to a first system voltage during a sample operation. The pre-amplifier is coupled to the local bit line and the main bit line. The pre-amplifier generates a read current on the main bit line according to a voltage of the local bit line during the sample operation and the sense operation. The data line is coupled to the main bit line during the sample operation and the sense operation. The sample reference unit is coupled to the data line. The sample reference unit generates a first reference current and a second reference current and records a reference control voltage during the sample operation, and generates the first reference current according to the reference control voltage during the sense operation. The sense amplifier is coupled to the data line, and senses a voltage of the data line during the sense operation.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
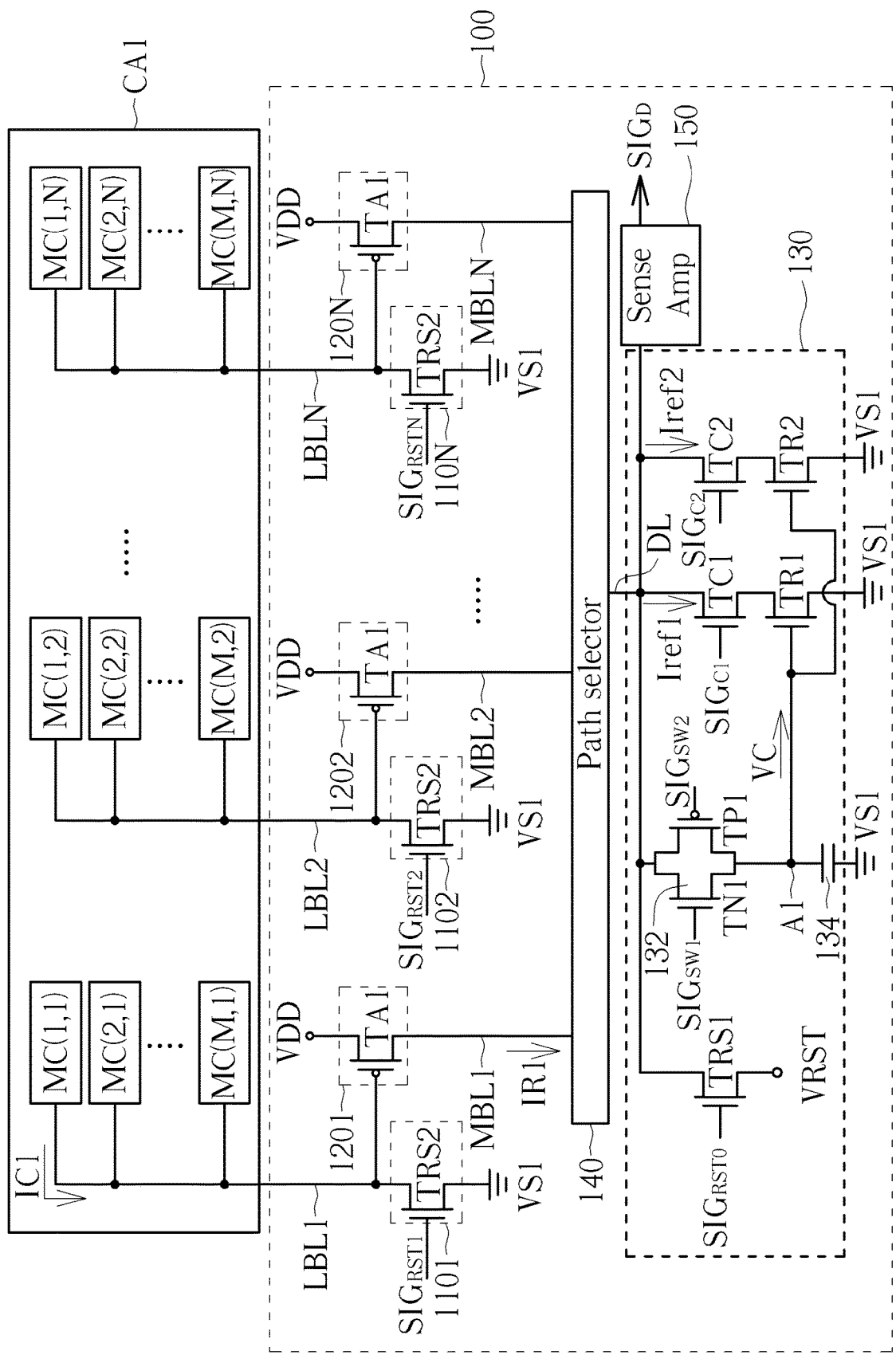
FIG. 1 shows a sense amplification circuit according to one embodiment of the present invention.

FIG. 1 shows a sense amplification circuit 100 according to one embodiment of the present invention. The sense amplification circuit 100 includes local bit lines LBL1 to LBLN, main bit lines MBL1 to MBLN, a data line DL, reset units 1101 to 110N, pre-amplifiers 1201 to 120N, a sample reference unit 130, a path selector 140, and a sense amplifier 150.

In some embodiments, the sense amplification circuit 100 can be used to read data from the cell array CA1. In FIG. 1, the cell array CA1 can include memory cells MC(1,1) to MC(M,N), where M and N are positive integers. In the cell array CA1, the memory cells MC(1,1) to MC(M,N) are arranged as M different words, and each word can include N bits of data. In this case, the memory cells MC(1,1) to MC(M,1) may be coupled to the same local bit line LBL1, the memory cells MC(1,2) to MC(M,2) may be coupled to the same local bit line LBL2, and so on.

In the prior art, when a memory cell is selected to be read, the cell current generated by the memory cell has to charge all local bit lines that are coupled to the same sense amplifier, making the read operation very time consuming.

However, in the sense amplification circuit 100, each of the local bit lines LBL1 to LBLN can be coupled to a corresponding pre-amplifier of the pre-amplifiers 1201 to 120N. Each of the pre-amplifiers 1201 to 120N can generate a read current according to the voltage of a corresponding local bit line of the local bit lines LBL1 to LBLN. Therefore, in FIG. 1, the local bit lines LBL1 to LBLN are not coupled to the same node directly. Also, the pre-amplifiers 1201 to 120N can help to amplify the cell currents generated by the memory cells MC(1,1) to MC(M,N), thereby increasing the reading speed.

Each of the pre-amplifiers 1201 to 120N can be coupled to a corresponding local bit line and a corresponding main bit line. For example, the pre-amplifier 1201 can be coupled to the local bit line LBL1 and the main bit line MBL1 while the pre-amplifier 120N can be coupled to the local bit line LBLN and the main bit line MBLN. In this case, the pre-amplifier 1201 can generate a read current IR1 on the main bit line MBL1 according to the voltage of the local bit line LBL1 during sample operations and sense operations of the memory cells MC(1,1) to MC(M,1), and the pre-amplifier 120N can generate a read current on the main bit line MBLN according to a voltage of the local bit line LBLN during sample operations and sense operations of the memory cells MC(1,N) to MC(M,N).

In addition, the reset units 1101 to 110N can each be coupled to a corresponding local bit line of the local bit lines LBL1 to LBLN. For example, the reset unit 1101 can be coupled to the local bit line LBL1, and the reset unit 110N can be coupled to the local bit line LBLN. The reset units 1101 to 110N can reset the local bit lines LBL1 to LBLN to a first system voltage VS1 during the sample operations before the sense operations, allowing the sense amplification circuit 100 to generate suitable reference currents during the sense operations according to the self-biased voltages obtained during the sample operations.

Furthermore, in order to sense the read currents generated by the pre-amplifiers 120I to 120N with the same sense amplifier 150, the path selector 140 can be coupled between the main bit lines MBL1 to MBLN and the data line DL. In some embodiments, during the sample operations and the sense operations of the memory cells MC(1,1) to MC(M,1), the path selector 140 can form an electrical connection between the main bit line MBL1 and the data line DL, and during the sample operations and the sense operations of the memory cells MC(1,N) to MC(M,N), the path selector 140 can form an electrical connection between the main bit line MBLN and the data line DL. Consequently, the data line DL will be coupled to the corresponding main bit line of the main bit lines MBL1 to MBLN during the sample operation and the sense operation of the corresponding memory cell of the memory cells MC(1,1) to MC(M,N).

In FIG. 1, the sample reference unit 130 and the sense amplifier 150 can be coupled to the data line DL. In some embodiments, when the memory cell MC(1,1) is requested to be read, a sample operation and a sense operation can be performed. During the sample operation, the reset unit 110I can reset the local bit line LBL1 to the first system voltage VS1, and the pre-amplifier 120I would generate the read current IR1. In this case, the sample reference unit 130 can generate the first reference current Iref1 and the second reference current Iref2 according to the read current IR1 and the self-biased reference control voltage VC.

Also, the sample reference unit 130 can also record the reference control voltage VC during the sample operation, so during the sense operation after the sample operation, the sample reference unit 130 can generate the first reference current Iref1 according to the reference control voltage VC. In addition, during the sense operation, the reset unit 110I can stop resetting the local bit line LBL1, so the cell current IC1 generated by the memory cell MC(1,1) may charge the local bit line LBL1. In some embodiments, if the memory cell MC(1,1) is, for example but not limited to, in a programmed state, then the memory cell MC(1,1) would generate a significant cell current IC1 and the voltage of the local bit line LBL1 would be raised. However, if the memory cell MC(1,1) is not programmed (namely, in an erased state), then the cell current IC1 generated by the memory cell MC(1,1) would be zero or insignificant, so the voltage of the local bit line LBL1 would remain close to the first system voltage VS1. In this case, the pre-amplifier 120I can generate the read current IR1 according to the voltage of the local bit line LBL1, and the voltage of the data line DL would be determined by the competition between the read current IR1 and the first reference current Iref1. Consequently, the sense amplifier 150 can sense the voltage of the data line DL and output a data signal $SIG_D$ accordingly during the sense operation. Since the reference control voltage VC used for generating the first reference current Iref1 during the sense operation is obtained in a self-biased condition during the sample operation, the reference current Iref1 generated by the sample reference unit 130 should be a good reference for identifying the data stored in the memory cell MC(1,1).

In FIG. 1, each of the pre-amplifiers 120I to 120N can include an amplifying transistor TA1. The amplifying transistor TA1 has a first terminal for receiving a second system voltage VDD, a second terminal coupled to a corresponding main bit line of the main bit lines MBL1 to MBLN, and a control terminal coupled to a corresponding local bit line of the local bit lines LBL1 to LBLN.

Also, the sample reference unit 130 includes a switch unit 132, a capacitor 134, a first control transistor TC1, at least one first reference transistor TR1, a second control transistor TC2, and at least one second reference transistor TR2.

The switch unit 132 has a first terminal coupled to the data line DL, and a second terminal. In FIG. 1, the switch unit 132 can include an N-type transistor TN1 and a P-type transistor TP1. The N-type transistor TN1 has a first terminal coupled to the first terminal of the switch unit 132, a second terminal coupled to the second terminal of the switch unit 132, and a control terminal for receiving a first switch signal $SIG_{SW1}$. The P-type transistor TP1 has a first terminal coupled to the first terminal of the switch unit 132, a second terminal coupled to the second terminal of the switch unit 132, and a control terminal for receiving a second switch signal $SIG_{SW2}$. In some embodiments, the first switch signal $SIG_{SW1}$ and the second switch signal $SIG_{SW2}$ can be complementary so that the N-type transistor TN1 and the P-type transistor TP1 can be turned on and turned off in a synchronous manner. However, in some embodiments, the switch unit 132 may omit the N-type transistor TN1 or the P-type transistor TP1 according to the system requirement.

The capacitor 134 has a first terminal A1 coupled to the second terminal of the switch unit 132, and a second terminal for receiving the first system voltage VS1. The first control transistor TC1 has a first terminal coupled to the data line DL, a second terminal, and a control terminal for receiving a first control signal $SIG_{C1}$. Each of the at least one first reference transistor TR1 has a first terminal coupled to the second terminal of the first control transistor TC1, a second terminal for receiving the first system voltage VS1, and a control terminal coupled to the first terminal A1 of the capacitor 134. The second control transistor TC2 has a first terminal coupled to the data line DL, a second terminal, and a control terminal for receiving a second control signal $SIG_{C2}$. Each of the at least one second reference transistor TR2 has a first terminal coupled to the second terminal of the second control transistor TC2, a second terminal for receiving the first system voltage VS1, and a control terminal coupled to the first terminal A1 of the capacitor 134.

Furthermore, the sample reference unit 130 can further include a reset transistor TRS1. The reset transistor TRS1 has a first terminal coupled to the data line DL, a second terminal for receiving a reset voltage VRST, and a control terminal for receiving a reset signal $SIG_{RST0}$. The reset signal $SIG_{RST0}$ can turn on the reset transistor TRS1 during a reset operation, so that the data line DL can be reset to the reset voltage VRST after the reset operation is performed. In some embodiments, the reset voltage VRST can be, for example but not limited to, substantially equal to the first system voltage VS1. Also, the reset signal $SIG_{RST0}$ can turn off the reset transistor TRS1 during the sample operation and the sense operation.

In FIG. 1, each of the reset units 110I to 110N can include a reset transistor TRS2. The reset transistor TRS2 has a first terminal coupled to a corresponding local bit line of the local bit lines LBL1 to LBLN, a second terminal for receiving the first system voltage VS1, and a control terminal for receiving a corresponding reset signal of the reset signal $SIG_{RST1}$ to $SIG_{RSTN}$.

Figure 2:
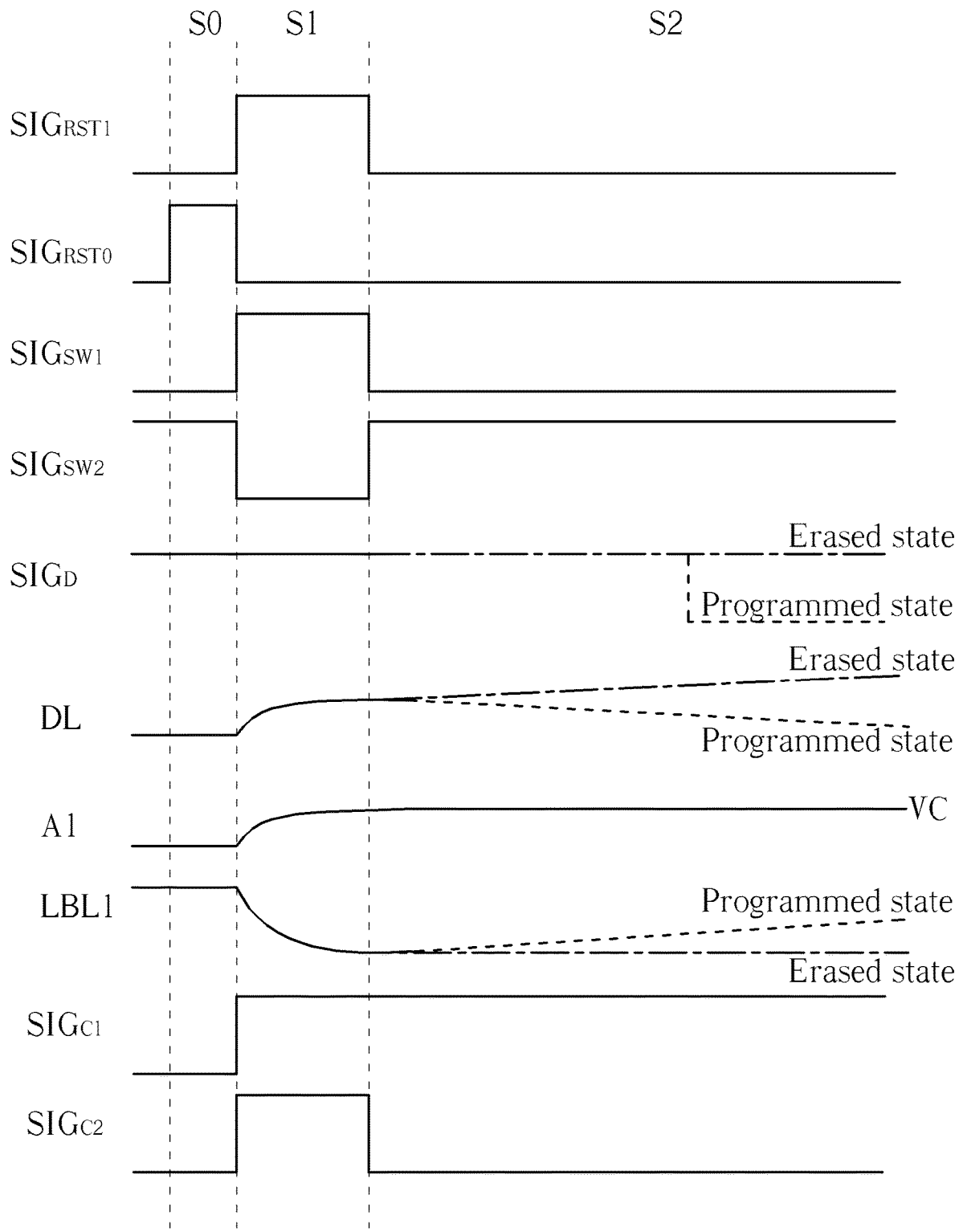
FIG. 2 shows the timing diagram of the signals received by the sense amplification circuit in FIG. 1 for reading the data stored in a memory cell.

FIG. 2 shows the timing diagram of the signals received by the sense amplification circuit for reading the data stored in the memory cell MC(1,1). In FIG. 2, the reset operation can be performed during a period S0 before the sample operation and the sense operation. During the reset operation, the reset signal $SIG_{RST0}$ can be at a high voltage, for example but not limited to the second system voltage VDD, for turning on the reset transistor TRS1 to reset the data line DL.

During a period S1, the sample operation is performed. During the sample operation, the reset signal $SIG_{RST1}$ is at a high voltage for turning on the reset transistor TRS2 of the reset unit 110₁, so the local bit line LBL1 can be reset to the first system voltage VS1 and the pre-amplifier 120₁ can generate the read current IR1, simulating the condition of zero cell current, that is, the erased state. Also, the first control signal $SIG_{C1}$ and the second control signal $SIG_{C2}$ can be at the high voltage for turning on the first control transistor TC1 and the second control transistor TC2. Furthermore, the first switch signal $SIG_{SW1}$ can be at the high voltage and the second switch signal $SIG_{SW2}$ can be at a low voltage, so the switch unit 132 can form an electrical connection between the data line DL and the first terminal A1 of the capacitor 134.

In this case, the read current IR1 can charge the capacitor 134 during the sample operation. Also, as the voltage of the first terminal A1 of the capacitor 134 is raised, the at least one first reference transistor TR1 and the at least one second reference transistor TR2 will be turned on. Since the first control transistor TC1 and the second control transistor TC2 are also turned on, the read current IR1 will mainly flow through a low impedance path formed by the first control transistor TC1 and the at least one first reference transistor TR1 and another low impedance path formed by the second control transistor TC2 and the at least one second reference transistor TR2. In this case, the at least one first reference transistor TR1 and the at least one second reference transistor TR2 can be self-biased by the end of the sample operation, and the self-biased reference control voltage VC can be recorded by the capacitor 134. Since the reference control voltage VC is obtained under a self-biased condition, the variations of the pre-amplifiers 120₁ to 120N and the control transistors TC1 and TC2 can all be compensated automatically during the sample operations, making the reference control voltage VC suitable for generating the reference current Iref1 for the sense operation.

During a period S2, the sense operation is performed. During the sense operation, the second reset signal $SIG_{RST1}$ is at the low voltage for turning off the reset transistor TRS2, so the reset unit 110₁ would stop resetting the local bit line LBL1 to the first system voltage VS1. In this case, the cell current IC1 generated by the memory cell MC(1,1) will start to charge the local bit line LBL1, and the pre-amplifier 120₁ would generate the read current IR1 accordingly. For example, if the memory cell MC(1,1) is in a programmed state, then the local bit line LBL1 may be charged to a higher voltage by the cell current IC1, and the read current IR1 generated by pre-amplifier 120₁ would decrease. However, if the memory cell MC(1,1) is in the erased state, then the current cell IC1 generated by the memory cell MC(1,1) would be rather small, so the local bit line LBL1 would be at the first system volte VS1 or remain close to the first system volte VS1, and the read current IR1 generated by pre-amplifier 120₁ would remain high.

Also, the first control signal $SIG_{C1}$ can be at the high voltage for turning on the first control transistor TC1 while the second control signal $SIG_{C2}$ can be at the low voltage for turning off the second control transistor TC2. Furthermore, the first switch signal $SIG_{SW1}$ can be at the low voltage and the second switch signal $SIG_{SW2}$ can be at the high voltage, so the switch unit 132 can cut off the electrical connection between the data line DL and the first terminal A1 of the capacitor 134. In this case, the at least one first reference transistor TR1 can be turned on according to the reference control voltage VC recorded by the capacitor 134, so the first reference current Iref1 can be generated during the sense operation. In this case, the voltage of the data line DL would be determined by the competition between the read current IR1 generated by the pre-amplifier 120₁ and the first reference current Iref1 generated by the at least one first reference transistor TR1.

In some embodiments, since the sum of the first reference current Iref1 and the second reference current Iref2 should be substantially equal to the read current IR1 by the end of the sample operation, the first reference current Iref1 generated according to the same reference control voltage VC during sense operation should be smaller than the read current IR1 if the memory cell MC(1,1) is in the erased state. Also, the first reference current Iref1 should be greater than the read current IR1 if the memory cell MC(1,1) is in the programmed state. Therefore, by sensing the voltage at the data line DL, the state of the memory cell MC(1,1) can be determined, and the data stored in the memory cell MC(1,1) can be read.

For example, if the memory cell MC(1,1) is in the programmed state, then the read current IR1 should be smaller than the first reference current Iref1, so the voltage of the data line DL will drop to the first system voltage VS1. However, if the memory cell MC(1,1) is in the erased state, then the read current IR1 should be greater than the first reference current Iref1, so the voltage of the data line DL will be raised to the second system voltage VDD.

That is, by obtaining the reference control voltage VC for the at least one first reference transistor TR1 and the at least one second reference transistor TR2 under the condition of zero cell current during the sample operation, the reference current Iref1 generated according to the same reference control voltage VC during the sense operation would be a good comparing basis for determining the state of the memory cell MC(1,1).

Furthermore, in some embodiments, the ratio between the first reference current Iref1 and the second reference current Iref2 can be adjusted according to the system requirement by adjusting the number of the first reference transistor TR1 and the second reference transistor TR2. For example, in one embodiment, the sample reference unit 130 may include nine first reference transistors TR1 and one second reference transistor TR2. In this case, the first reference current Iref1 used for the sense operation would be substantially equal to 90% of the read current IR1 obtained during the sample operation under the zero cell current condition, allowing the sense amplifier 150 to determine the result with a higher speed and better accuracy. However, in some other embodiments, the number of the first reference transistors TR1 and the number of the second reference transistors TR2 can be determined according to the system requirement.

In FIG. 1, the sense amplifier 150 can be a single ended amplifier. In this case, the input terminal of the sense amplifier 150 can be coupled to the data line DL, and the output terminal of the sense amplifier 150 can output a data signal $SIG_D$. However, in some other embodiments, the sense amplifier 150 can be a differential amplifier.

Figure 3:
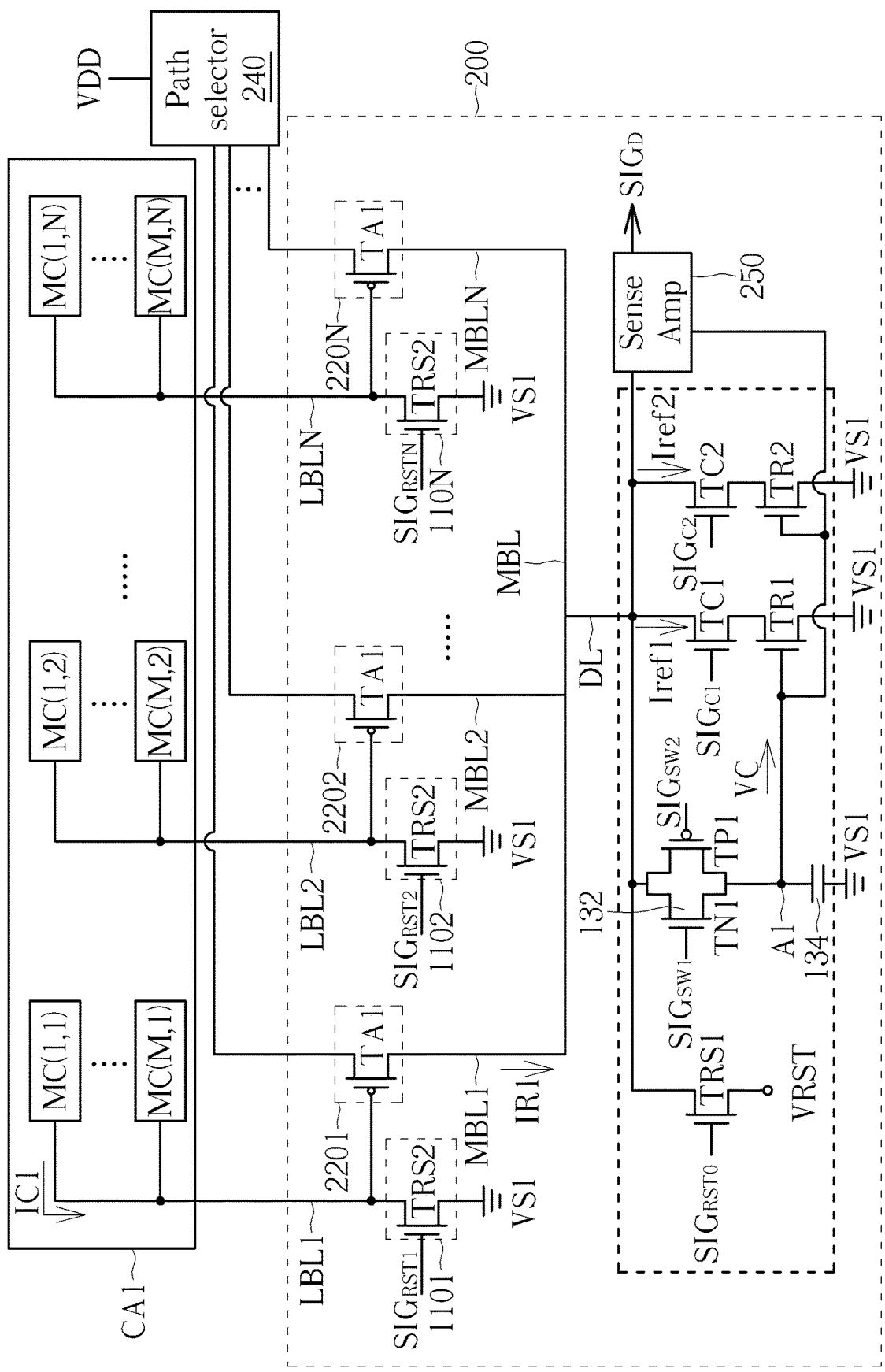
FIG. 3 shows a sense amplification circuit according to another embodiment of the present invention.

FIG. 3 shows a sense amplification circuit 200 according to one embodiment of the present invention. The sense amplification circuit 200 and the sense amplification circuit 100 have similar structures and can be operated with similar principles. However, the sense amplifier 250 of the sense amplification circuit 200 is a differential amplifier. In this case, the first input terminal of the sense amplifier 250 can be coupled to the data line DL, the second input terminal of the sense amplifier 250 can be coupled to the first terminal A1 of the capacitor 134, and an output terminal of the sense amplifier 250 can output a data signal $SIG_D$.

In addition, in FIG. 3, the path selector 240 can have a first terminal for receiving a second system voltage VDD, and second terminals coupled to the pre-amplifiers 210₁ to 210N. The path selector 240 can form an electrical connection between the first terminal and one of the second terminals of the path selector 240 during the sample operation and the sense operation. In this case, the second terminals of the pre-amplifiers 220₁ to 220N can be coupled to the same main bit line MBL, and main bit line MBL can be coupled to the data bit line DL directly. That is, the connection of the path selector 140 can be adjusted as the path selector 240 according to the system requirement.

In summary, the sense amplification circuits provided by the embodiments of the present invention can obtain the reference control voltage for generating the reference currents in a self-biased condition during the sample operation, so the variations of the pre-amplifiers and the control transistors can be compensated automatically during the sample operations. Therefore, the reference current generated by the sample reference unit during the sample operation can be a good reference for identifying the data stored in the memory cells, allowing the sense amplification circuits to read the data of the memory cells with a higher speed and better accuracy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A self-biased sense amplification circuit comprising:
   a local bit line coupled to a memory cell, and configured to receive a cell current generated by the memory cell during a sense operation;
   a reset unit coupled to the local bit line, and configured to reset the local bit line to a first system voltage during a sample operation;
   a main bit line;
   a pre-amplifier coupled to the local bit line and the main bit line, and configured to generate a read current on the main bit line according to a voltage of the local bit line during the sample operation and the sense operation;
   a data line coupled to the main bit line during the sample operation and the sense operation;
   a sample reference unit coupled to the data line, and configured to generate a first reference current and a second reference current and record a reference control voltage during the sample operation and generate the first reference current according to the reference control voltage during the sense operation; and
   a sense amplifier coupled to the data line, and configured to sense a voltage of the data line during the sense operation.

2. The self-biased sense amplification circuit of claim 1, wherein the sample reference unit comprises:
   a switch unit having a first terminal coupled to the data line, and a second terminal;
   a capacitor having a first terminal coupled to the second terminal of the switch unit, and a second terminal configured to receive the first system voltage;
   a first control transistor having a first terminal coupled to the data line, a second terminal, and a control terminal configured to receive a first control signal;
   at least one first reference transistor each having a first terminal coupled to the second terminal of the first control transistor, a second terminal configured to receive the first system voltage, and a control terminal coupled to the first terminal of the capacitor;
   a second control transistor having a first terminal coupled to the data line, a second terminal, and a control terminal configured to receive a second control signal; and
   at least one second reference transistor each having a first terminal coupled to the second terminal of the second control transistor, a second terminal configured to receive the first system voltage, and a control terminal coupled to the first terminal of the capacitor.

3. The self-biased sense amplification circuit of claim 2, wherein during the sample operation:
   the first control signal is configured to turn on the first control transistor;
   the second control signal is configured to turn on the second control transistor; and
   the switch unit is configured to form an electrical connection between the data line and the first terminal of the capacitor.

4. The self-biased sense amplification circuit of claim 2, wherein during the sense operation:
   the first control signal is configured to turn on the first control transistor;
   the second control signal is configured to turn off the second control transistor;
   the switch unit is configured to cut off the electrical connection between the data line and the first terminal of the capacitor; and
   the reset unit is further configured to stop resetting the local bit line to the first system voltage.

5. The self-biased sense amplification circuit of claim 2, wherein the switch unit comprises:
   an N-type transistor having a first terminal coupled to the first terminal of the switch unit, a second terminal coupled to the second terminal of the switch unit, and a control terminal configured to receive a first switch signal.

6. The self-biased sense amplification circuit of claim 5, wherein the switch unit further comprises:
   a P-type transistor having a first terminal coupled to the first terminal of the switch unit, a second terminal coupled to the second terminal of the switch unit, and a control terminal configured to receive a second switch signal;
   wherein the first switch signal and the second switch signal are complementary.

7. The self-biased sense amplification circuit of claim 2, wherein the sample reference unit further comprises a first reset transistor having a first terminal coupled to the data line, a second terminal configured to receive a reset voltage, and a control terminal configured to receive a first reset signal, and the first reset signal is configured to turn on the first reset transistor during a reset operation and turn off the first reset transistor during the sample operation and the sense operation.

8. The self-biased sense amplification circuit of claim 2, wherein the sense amplifier is a differential amplifier having a first input terminal coupled to the data line, a second input terminal coupled to the first terminal of the capacitor, and an output terminal configured to output a data signal.

9. The self-biased sense amplification circuit of claim 1, wherein the sense amplifier is a single ended amplifier having an input terminal coupled to the data line, and an output terminal configured to output a data signal.

10. The self-biased sense amplification circuit of claim 1 further comprising a path selector coupled between the main bit line and the data line, and configured to form an electrical connection between the main bit line and the data line during the sample operation and the sense operation.

11. The self-biased sense amplification circuit of claim 1 further comprising a path selector having a first terminal configured to receive a second system voltage, and a second terminal coupled to the pre-amplifier, and configured to form an electrical connection between the first terminal and the second terminal of the path selector during the sample operation and the sense operation;
   wherein the main bit line and the data bit line are directly coupled.

12. The self-biased sense amplification circuit of claim 1, wherein the pre-amplifier comprises an amplifying transistor having a first terminal configured to receive a second system voltage during the sample operation and the sense operation, a second terminal coupled to the main bit line, and a control terminal coupled to the local bit line.

13. The self-biased sense amplification circuit of claim 1, wherein the reset unit comprises a second reset transistor having a first terminal coupled to the local bit line, a second terminal configured to receive the first system voltage, and a control terminal configured to receive a second reset signal.

* * * * *